United States Patent [19]

Ebina

[11] Patent Number: 5,304,925
[45] Date of Patent: Apr. 19, 1994

[54] SEMICONDUCTOR DEVICE
[75] Inventor: Akihiko Ebina, Suwa, Japan
[73] Assignee: Seiko Epson Corporation, Tokyo, Japan
[21] Appl. No.: 798,141
[22] Filed: Nov. 26, 1991
[30] Foreign Application Priority Data
Nov. 28, 1990 [JP] Japan ................................ 2-328045
[51] Int. Cl.$^5$ ............................................ G01R 31/26
[52] U.S. Cl. .................................. 324/158 T; 324/719
[58] Field of Search ............ 324/158 T, 158 D, 158 R, 324/719; 257/48

[56]  References Cited
U.S. PATENT DOCUMENTS 4,144,493  3/1979  Lee et al. ...................... 324/158 T
4,542,340  9/1985  Chakravarti et al. ........... 324/158 D
4,896,108  1/1990  Lynch et al. ................... 324/158 T
4,994,736  2/1991  Davis et al. .................... 324/158 T Primary Examiner—Ernest F. Karlsen
Attorney, Agent, or Firm—Oliff & Berridge

[57]  ABSTRACT

A test circuit for evaluating the characteristics of an component formed on the surface of a semi-conductor substrate. The test circuit comprises at least two MOS field effect transistors having the same gate width and different gate lengths, and measuring electrodes mounted on opposite ends of each gate and enageable with probes when measuring the test circuit. The test circuit measures typical characteristic data of MOSFETs to be used in a semiconductor device with good match by an electrical means.

7 Claims, 4 Drawing Sheets

SEMICONDUCTOR DEVICE

BACKGROUND OF THE INVENTION

1. Field of the Invention

This invention relates to a semiconductor device including a test circuit for evaluating the characteristics of components of the semiconductor device, and more particularly to an improvement of such test circuit.

2. Description of the Related Art

Integrated-circuit chips contain a good assortment of components. A MOS field effect transistor (hereinafter called "MOSFET") is one of such component. It is essential to know the precise characteristics of the MOSFET components of the integrated circuit. Consequently, in many instances, test circuits for measuring the characteristics of individual components of an integrated circuit are formed on a semiconductor substrate such as wafer independently.

The characteristics of MOSFET are tested to evaluate the electrical characteristics of the components. Therefore, it is preferable to perform all the measurement electrically and to obtain consistent data.

However it is impossible for conventional test circuits to electrically measure essential characteristics such as the effective channel length and gate length necessary for controlling the effective channel length. For instance, the gate length has to be measured optically based on a measurement principle which differs from the principles of electrical measurement. Therefore, the data that are obtained by the different measurement principles are sometimes inconsistent. It also takes time to perform the measurements.

Conventional test circuits have difficulty precisely measuring the characteristics of the MOSFET by a simple method. Specifically, different test circuits have to be used to measure the effective channel length and the sheet resistance of the MOSFET, respectively, resulting in test circuits that occupy a large space on the wafer.

FIG. 6 of the accompanying drawings show an example of a test circuit MOSFET. With MOSFET, the effective channel length should be precisely measured, since it is as important as the threshold voltage.

The test circuit 100 includes at least two MOSFETs 10a, 10b whose gates 12a, 12b have the same width W but has different lengths L. The sources, drains and gates of these MOSFETs 10a, 10b are respectively connected to metal wirings and measuring electrodes 16, 18, 20a, 20b via contact holes 14.

A computer-controlled measuring unit (not shown) contacts probes to the measuring electrodes 16, 18, 20a, 20b of the test circuit 100. For example a predetermined voltage is applied to the gates of MOSFETs 10a and 10b to measure the current across the source and the drain. The effective channel length is then calculated based on the current and applied voltage characteristics of MOSFETs 10a and 10b.

FIG. 7 shows a test circuit 110 for measuring the sheet resistance of MOSFET. A gate 12 of MOSFET is usually made of polycrystalline silicon, for example, similar to a resistor component. Therefore, it is necessary to measure the resistance of the MOSFET gate as the sheet resistance (specified in units of ohms per square) after excluding the influence of the parasitic resistance. For this purpose, the test circuit 110 includes an element 22 for measuring the sheet resistance. The element 22 is connected to four measuring electrodes 24, 26, 28, 30 via contact holes 14. A computer-controlled measuring unit (not shown) contacts its probes to these measuring electrodes 24, 26, 28, 30, measuring the sheet resistance of the element 22.

The test circuits 100, 110 are applicable to electrically measure the effective channel length and the sheet resistance of MOSFETs. A typical application of these test circuits is for the evaluation of trial products using the measured results.

In practice, such test circuits 100, 110 are also applied to evaluate mass-produced articles. In such case, it is also required to obtain data such as the gate length for controlling the effective channel length, difference between the gate length and the effective channel length, and the lateral diffusion length of the source and drain.

However these data cannot be obtained from the electrical measurements of the test circuits 100, 110. For example, the gate length has to be optically measured by using laser beams.

The optical measurement should be carried out for an exposed gate region 12 during the fabrication of the test cirucit 100 under the conditions quite different from the electrical measurement. Further, the gate length obtained by the optical measurement, which is different from the principle of electrical measurement, does not always match the effective channel length and the sheet reistance obtained by the electrical measurement. Therefore, the obtained data are not always reliable enough to evaluate MOSFETs.

There has been a great demand to make compact test circuits and to reduce the number of measuring electrodes to effectively use the measuring probes, so that the test circuits are appliable to evaluation of the mass-produced articles without adversely affecting highly integrated circuits.

Conventionally, two test circuits 100, 110 are required to measure the important data such as the effective channel length and the sheet resistance as shown in FIGS. 6 and 7. This means that these test circuits not only occupy rather large spaces on the semiconductor substrate but also need a number of measuring electrodes.

Specifically, the test circuit 110 for measuring the sheet resistance is large and needs many electrodes.

SUMMARY OF THE INVENTION

It is therefore an object of this invention to provide a semiconductor device which includes test circuits for electrically measuring the typical characteristics of MOSFETs contained in the semiconductor device to obtain consistent data.

Another object of the invention is provide a semiconductor device including test circuits which occupy little space on a semiconductor substrate and requires a small number of measuring electrodes.

The first aspect of the invention provides, a semiconductor device including a test circuit for evaluating characteristics of components formed on the surface of a semiconductor substrate. The test circuit has at least two MOS field effect transistors whose gates have an equal width but have different lengths, and gate measuring electrodes connected to opposite ends of the gates and adapted to be contacted with probes for measuring the test circuit.

The second aspect of the invention provides, a semiconductor device including a test circuit for evaluating characteristics of components formed on the surface of a semiconductor substrate, the test circuit has at least two MOS field effect transistors whose gates have an equal width but have different lengths, a plurality of resistors made of the same material as the gates and having the length and width same as the length and width of the gates, and resistance measuring electrodes connected to opposite ends of the resistors and adapted to be contacted with probes for measuring the test circuit.

The test circuit of the invention can electrically measure the typical characteristics of MOSFETs of the semiconductor device, thereby obtaining consistent data.

The test circuit is so compact that it does not occupy a large space on the semiconductor substrate, and can minimize the number of measuring electrodes, thereby enabling facrication of highly integrated circuits.

DETAILED DESCRIPTION

Figure 1A:
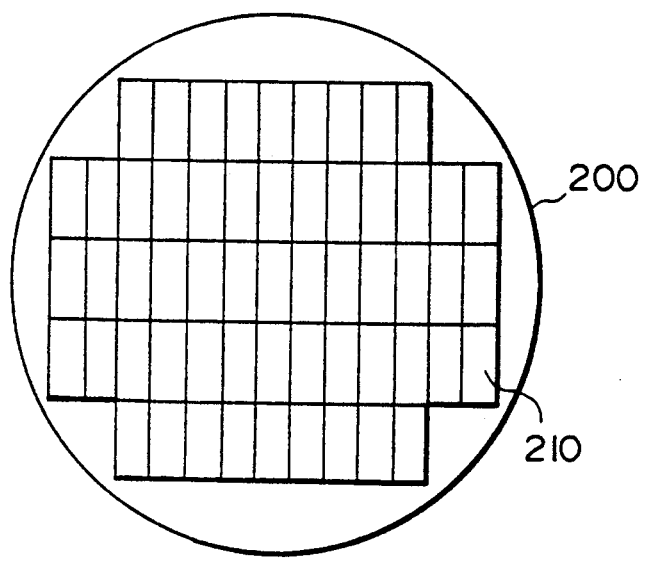
FIGS. 1(A) and FIG. 1(B) are plan views respectively showing a semiconductor device according to a first embodiment of this invention, and a test circuit for the semiconductor device.
Figure 1B:
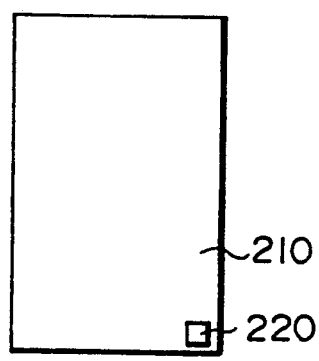

FIG. 1(A) shows a semiconductor device comprising a wafer 200 as semiconductor substrates, and a plurality of integrated circuits 210 formed on the wafer 200. As shown in FIG. 1(B), on the semiconductor substrate of each integrated circuit 210, there is a test circuit 220 for evaluating the characteristics of the components of the integrated circuit 210. The test circuits 220 may be located in gaps between the integrated circuits if necessary.

Figure 2:
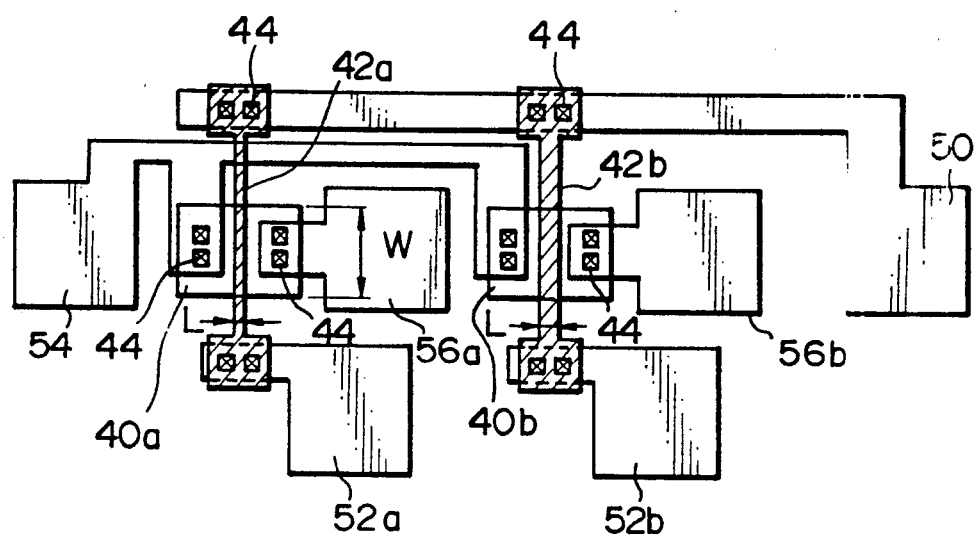
FIG. 2 is a diagram showing a main part of a test circuit in the semiconductor device of FIG. 1.

The test circuit 220 has a configuration as shown in FIG. 2 to electrically measure the characteristics of MOSFETs as the main components of the integrated circuit 210. The test circuit 220 includes n (n is an integer equal to or large than 2) MOSFETs 40 whose gates 42 are equal in width W but are different in length L. For simplification, only two MOSFETs 40a, 40b are shown in FIG. 2.

One end of each of the gates 42a, 42b of MOSFETs 40a, 40b are connected to a common metal wiring-and-measuring electrode 50 via contact holes 44, and the other ends of these gates 42a, 42b are connected to their corresponding metal wiring-and-measuring electrodes 52a, 52b, respectively, via the contact holes 44.

The sources of MOSFETs 40a, 40b are connected to a metal wiring-and-measuring electrode 54 via the contact holes 44. The drains of MOSFETs 40a, 40b are connected to metal-wiring-and-measuring electrodes 56a, 56b, respectively, via the contact holes 44.

Figure 4:
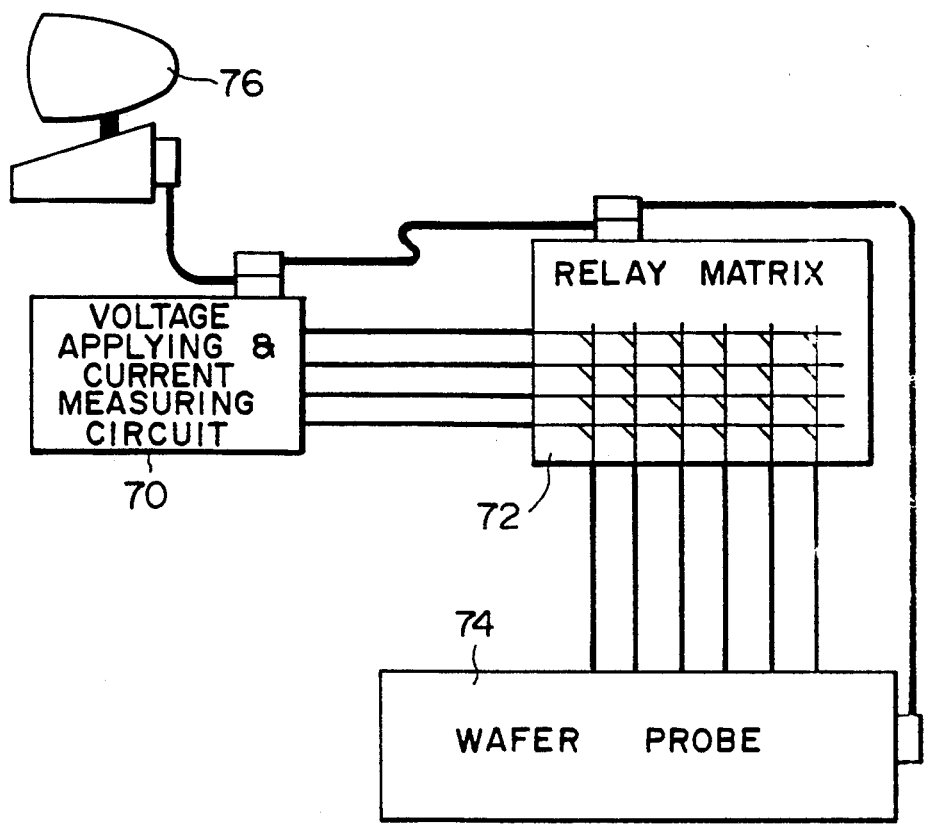
FIG. 4 is a block diagram showing a measuring unit for the test circuit.

One example of a measuring unit is shown in FIG. 4. The measuring unit uses the foregoing test circuits 220 to test the characteristics of MOSFETs, comprising a circuit 70 for measuring the applying voltage and measuring current, a relay matrix 72, a plurality of wafer probes 74, and a computer 76.

The wafer probes 74 are adapted to be contacted with the measuring electrodes 50, 52a, 52b, 54, 56a, 56b of the test circuits 220 as shown in FIG. 2.

The circuit 70 applies voltage to a corresponding wafer probe 74 via the relay matrix 72, measuring via the wafer probe 74 and relay matrix 72 the current and voltage in MOSFETs 40a, 40b.

Based on the measured voltage-current characteristics of MOSFETs 40a, 40b, the computer 76 calculates characteristics of MOSFETs 40a, 40b such as the effective channel length, sheet resistance and gate length to obtain consistent results.

The gate length and the effective channel length of MOSFETs 40a, 40b are measured and evaluated in the following manner.

First, measurement of the actual gate lengths of $L_G$ MOSFETs 40a, 40b will be described.

There exists a relationship:

$$L_G = L_{drawn} - dL \quad (1)$$

where $L_{drawn}$ stands for design dimensions of the gates 42a, 42b; $L_G$, actual lengths of the gates 42a, 42b; and dL, a pattern conversion difference (difference between $L_{drawn}$ and $L_G$).

Since the design dimensions $L_{drawn}$ are already known, the actual gate length $L_G$ can be obtained by calculating the pattern conversion difference dL.

A predetermined voltage is then applied between the common measuring electrode 50 and the measuring electrodes 52a, 52b corresponding to MOSFETs 40a, 40b. The resistances R of the gates 42a, 42b are determined based on the applied voltage and the current flowing through the gates 42a, 42b.

The resistances R of the gates 42a, 42b are expressed by the following formula by using the design dimensions $L_{drawn}$, the pattern conversion difference dL, the effective channel width $W_{eff}$, and the sheet resistance $\rho_0$:

$$R = \rho s \frac{W_{eff}}{L_{drawn} - dL} \quad (2)$$

A reciprocal of the formula (2) can be expressed as:

$$R^{-1} = \frac{1}{\rho s W_{eff}} (L_{drawn} - dL) \quad (3)$$

x, z, p and q are defined by:

$$x = L_{drawn}$$

$$z = R^{-1}$$

$$p = \frac{1}{\rho s W_{eff}} \quad (4)$$

$$q = \frac{-dL}{\rho s W_{eff}}$$

The formula (3) can be rewritten as:

$$Z = px + q \quad (5)$$

It is assumed that the test circuit has n-type MOSFETs 40. The design dimensions $L_{drawn}$ of the gates 42 of each MOSFETs 40 are defined to be $x_1, x_2, \ldots x_i, \ldots x_n$, and reciprocals of the resistances of the gates 42 are defined by $Z_1, Z_2, \ldots Z_i, \ldots Z_n$.

The difference between the opposite sides of the formula 5, i.e. the sum S of a square of the statistical error, can be expressed by:

$$S = \Sigma(px_i + q - z_i)^2 \tag{6}$$

the formula (6) is differentiated by "p" and "q". The result is made equal to zero to obtain simultaneous equations, which are solved for "p" and "q". Then, "p" and "q" are obtained to minimize S in the formula (6), which is expressed by:

$$p = \frac{\Sigma x_i z_i - \Sigma x_i \Sigma z_i / n}{\Sigma x_i^2 - (\Sigma x_i)^2 / n} \tag{7}$$

$$q = \frac{\Sigma z_i \Sigma x_i^2 - \Sigma x_i z_i \Sigma x_n}{n \Sigma x_i^2 - (\Sigma x_i)^2}$$

The actual gate lengths $L_G$ of MOSFETs 40a, 40b, respectively can be obtained from the following formula by using "p", "q" and the design dimensions $L_{drawn}$ of the gates.

$$L_G = L_{drawn} - dL = L_{drawn} + \frac{q}{p} \tag{8}$$

According to this invention, the actual gate length $L_G$ can be electrically measured instead of the conventional optical method.

With this embodiment, the sheet resistance $\rho_0$ can be obtained by using the defining expression for P in the formula (4). Therefore, it is not necessary to use a large sheet resistance measuring element which is used in the conventional method. The test circuit can be scaled down and the number of terminals can be reduced, thereby occupying a smaller space on the integrated circuit 210. This enables the integrated circuit to contain more components.

Next, measurement of the effective channel lengths $L_{eff}$ of MOSFETs 40a, 40b will be described.

Figure 5:
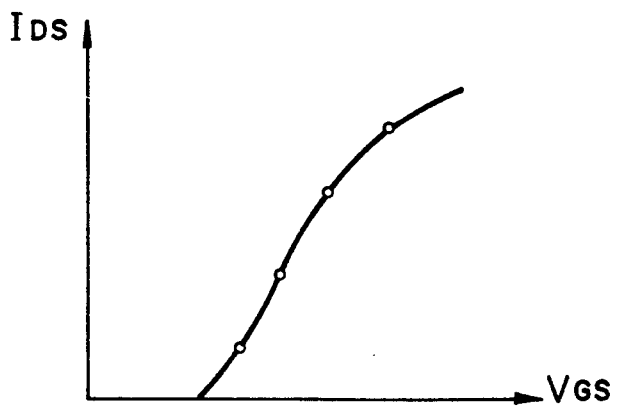
FIG. 5 is a voltage-current characteristic curve of MOSFET.
Figure 6:
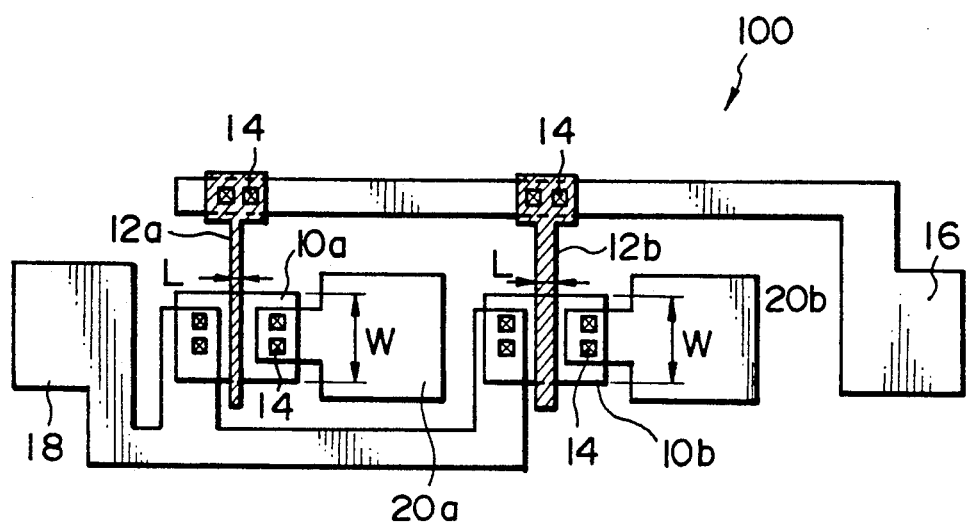
FIG. 6 is a diagram showing part of a conventional test circuit.
Figure 7:
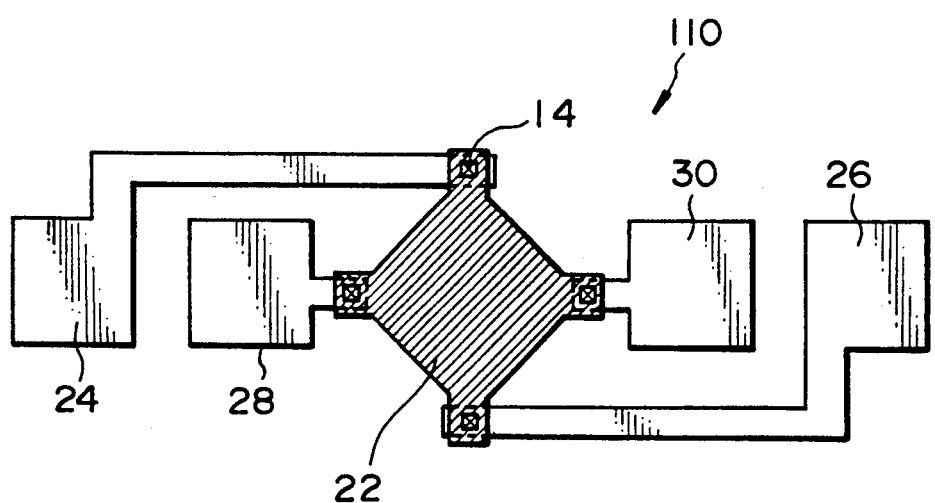
FIG. 7 is a diagram showing part of another conventional test circuit.

A predetermined voltage $V_{GS}$ is applied between the gate and the source by using the measuring electrodes 50, 54, 56a, 56b, thereby measuring the voltage $V_{DS}$ and the current $I_{DS}$ between the drain and the source. If the voltage $V_{GS}$ and the current $I_{DS}$ are measured at several points while varying the gate voltage, a characteristics curve of FIG. 5 is obtained. This curve is approximated by the following formula:

$$I_{DS} = \frac{\beta_0}{1 + \theta(V_{GS} - V_{TH})} \left( V_{GS} - V_{TH} - \frac{1 + F_B}{2} V_{DS} \right) V_{DS} \tag{9}$$

where $\beta_0$, $\theta$, and $V_{TH}$ are constants proper to MOSFETs 40a, 40b. The data, as shown in FIG. 5, are obtained for each of MOSFETs 40a, 40b, and substituted in the formula (9) to perform the necessary calculations. These three constants are determined for MOSFETs 40a, 40b. $\theta$ is a parameter expressing the curvature of the characteristic curve of FIG. 5. $V_{TH}$ is a threshold value. $\beta_0$ is expressed by:

$$\beta_0 = \mu_0 C_{ox} \frac{W_{eff}}{L_{eff}} \tag{10}$$

where $\mu_0$ is the mobility of electrons, $C_{ox}$ is the gate capacity, and $W_{eff}$ is an effective channel width.

The gate lengths $L_G$ of the gates 42a, 42b are determined as described above. The gate length $L_G$ of each MOSFET 40a and 40b and the effective channel length $L_{eff}$ are expressed as follows, where $\Delta L$ is a difference between the gate length and the effective channel length.

$$L_{eff} = L_G - \Delta L \tag{11}$$

By substituting the formula 10 into the formula 11, a reciprocal of the formula 11 can be obtained as:

$$\beta_0^{-1} = \frac{1}{\mu_0 C_{ox} W_{eff}} (L_G - \Delta L) \tag{12}$$

To simplify the formulas, y, a and b are defined as:

$$y = \beta_0^{-1} \tag{13}$$

$$a = \frac{1}{\mu_0 C_{ox} W_{eff}}$$

$$b = \frac{-\Delta L}{\mu_0 C_{ox} W_{eff}}$$

The formula 12 can be expressed as:

$$y = aL_G + b \tag{14}$$

It is assumed that there are n-type MOSFETs 40 in a test circuit 200 and that the gate length of each MOSFET 40 has been already obtained as shown by the following formula through the foregoing measurement.

$$L_G = L_{G1}, L_{G2}, \ldots, L_{Gn} \tag{15}$$

The difference between the opposite sides of the formula 14, i.e. square sum S of the statistical error, is expressed by:

$$S = \sum_{i=1}^{n} (aL_{Gi} + b - y_i)^2 \tag{16}$$

a and b are determined to minimize S based on the method of the least squares similar to the statical error, is expressed by:

$$a = \frac{\Sigma L_{Gi} y_i - \Sigma y_i \Sigma L_{Gi}/n}{\Sigma L_{Gi}^2 - (\Sigma L_{Gi})^2/n} \tag{17}$$

$$b = \frac{\Sigma y_i \Sigma L_{Gi}^2 - \Sigma L_{Gi} y_i \Sigma L_{Gi}}{n \Sigma L_{Gi}^2 - (\Sigma L_{Gi})^2}$$

$\Delta L$ is counted back from the defining formula for a and b of the formula (13) as:

$$L = -\frac{b}{a} \tag{18}$$

Therefore, the effective channel length $L_{eff}$ of each MOSFET 40 can be determined based on $\Delta L$ and the actual gate length $L_G$ as follows:

$$L_{eff} = L_G - \Delta L = L_G + \frac{b}{a} \qquad (19)$$

According to the invention, the basic characteristic data such as the gate length $L_G$, effective channel length $L_{eff}$, and lateral diffusion lengths of the source and drain of MOSFETs 40 can be electrically measured by using the common test circuit. Therefore, the characteristic data which are self-matching and suitable for the evaluation can be obtained precisely and quickly.

Figure 3:
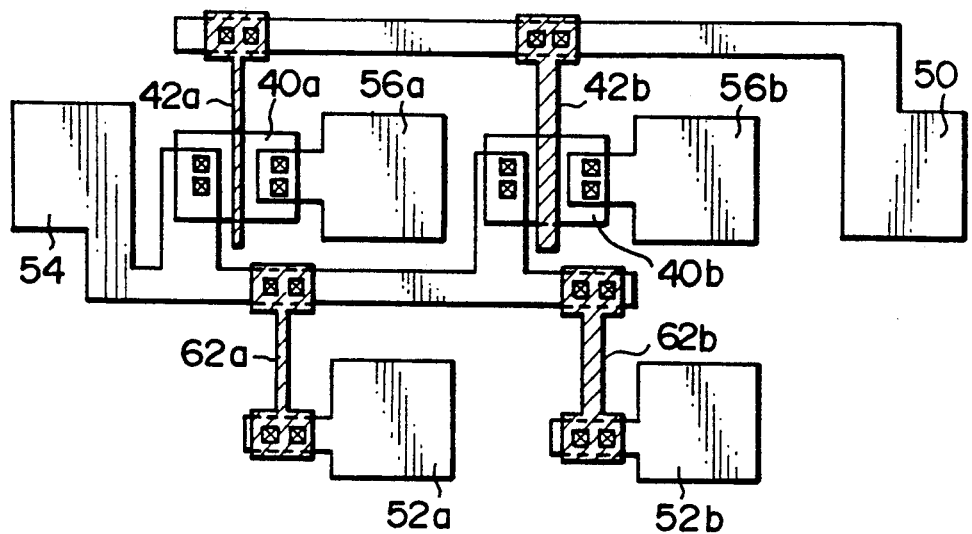
FIG. 3 is a diagram showing a main part of a test circuit in a semiconductor device according to a second embodiment of the invention.

Another embodiment of the test circuit is shown in FIG. 3. Similar and corresponding parts or elements are designated by like reference numerals as those of FIG. 2.

The measuring electrode 50 is connected to only one end of each of the gates 42a, 42b of MOSFETs 40a, 40b.

The test circuit includes a plurality of resistors 62a, 62b whose length and width are equal to the length and width of the gates 42a, 42b of MOSFETs 40a, 40b.

The resistors 62a, 62b are made of the same material as the material of the gates 42a, 42b.

One end of each of the resistors 52a, 62b are connected to the measuring electrode 54 via the contact holes 44.

The actual gate length $L_G$ of the MOSFETs 40a, 40b is obtained by using the resistors 62a, 62b corresponding to the gates 42a, 52b as described with reference to the first embodiment.

The effective channel length of MOSFETs 40a, 40b is also obtained by using the associated electrodes 50a, 54, 56a, 56b likewise.

Although certain preferred embodiments have been shown and described, it should be understood that many changes and modifications may be made therein without departing from the scope of the appended claims.

As described so far, the all typical characteristics of MOSFETs of the integrated circuits can be electrically measured by the test circuit of the invention. The obtained data are consistent.

The test circuit of this invention if compact enough to occupy a small space on the semiconductor substrate and can reduce the number of the measuring electrodes, so that highly integrated semiconductor circuits can be fabricated.

What is claimed is:

1. A semiconductor device having a test circuit formed on the surface of a semiconductor substrate for evaluating characteristics of components, the test circuit comprising:

a plurality of MOS field effect transistors, each transistor having a gate, the gates having equal width in a longitudinal direction between first and second ends of said gates but different lengths in a traverse direction;

each of said first and second ends of each of said gates in said longitudinal direction being connected to one of a plurality of gate measuring electrodes; and said gate measuring electrodes adapted to be contacted with probes for providing electrical contact with said test circuit.

2. The semiconductor device of claim 1, wherein said test circuit includes:

a source measuring electrode connected to a source of at least one of said plurality of MOS field effect transistors via at least one contact hole;

a plurality of drain measuring electrodes, each connected to a drain of one of said plurality of MOS field effect transistors via a contact hole; and the first and second ends of said gates connected to the gate measuring electrodes via contact holes.

3. The semiconductor device of claim 1, further comprising a measuring unit to be used with the test circuit, said measuring unit comprising:

a plurality of wafer probes to contact the measuring electrodes of the test circuit;

means for applying a measuring voltage to any of said wafer probes to produce a generated voltage and a current in one of said plurality of MOS field effect transistors;

means for measuring a current flowing through said MOS field effect transistor;

means for measuring the generated voltage through said wafer probe; and arithmetic means for calculating the effective channel length and actual gate length of said MOS field effect transistor based on the measured voltage-current characteristics of the MOS field effect transistor.

4. The semiconductor device of claim 2, further comprising a measuring unit to be used with the test circuit, said measuring unit comprising:

a plurality of wafer probes to contact the measuring electrodes of the test circuit;

means for applying a measuring voltage to any of said wafer probes to produce a generated voltage and a current in one of the plurality of MOS field effect transistors;

means for measuring a current flowing through each MOS field effect transistor;

means for measuring a generated voltage through said wafer probe; and arithmetic means for calculating the effective channel length and actual gate length of said MOS field effect transistor based on the measured voltage-current characteristics of the MOS field effect transistor.

5. The measuring unit of claim 4, further comprising:

means for applying a predetermined voltage between the first and second ends of each of the gates;

means for measuring the current flowing through the gates;

arithmetic means for calculating resistances of the gates based on the voltage applied to the gates and the current flowing through the gates; and means for calculating the actual gate length of the gates based on the resistances and design dimensions of the gates.

6. The measuring unit of claim 5, further comprising:

means for varying the voltage applied between the gate and source of each of said plurality of MOS field effect transistors;

means for measuring the voltage-current characteristics of the drain-source voltage and the drain-source current of each said MOS field effect transistor using the applied voltages as parameters; and arithmetic means for calculating the effective channel length of each said MOS field effect transistor based on the actual gate length of the gates of each said MOS field effect transistor and the voltage-current characteristics.

7. The semiconductor device of claim 1, wherein the first ends of said gates are commonly connected to a single one of the plurality of gate measuring electrodes.

* * * * *